(12) United States Patent
Kajigaya et al.

(10) Patent No.: US 7,933,141 B2
(45) Date of Patent: Apr. 26, 2011

(54) SEMICONDUCTOR MEMORY DEVICE

(75) Inventors: Kazuhiko Kajigaya, Tokyo (JP);
Soichiro Yoshida, Tokyo (JP);
Tomonori Sekiguchi, Tokyo (JP);
Riichiro Takemura, Tokyo (JP);
Yasutoshi Yamada, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 95 days.

(21) Appl. No.: 12/416,432

(22) Filed: Apr. 1, 2009

(65) Prior Publication Data

US 2009/0251948 A1 Oct. 8, 2009

(30) Foreign Application Priority Data

Apr. 4, 2008 (JP) ................................. 2008-098246

(51) Int. Cl.
*G11C 11/24* (2006.01)
(52) U.S. Cl. .................. 365/149; 365/207; 365/189.14; 365/189.15; 365/189.16
(58) Field of Classification Search .................. 365/149, 365/207, 189.14, 189.15, 189.16
See application file for complete search history.

(56) References Cited

U.S. PATENT DOCUMENTS

| | | | | |
|---|---|---|---|---|
| 7,542,343 B1 * | 6/2009 | Kim | .......................... | 365/185.11 |
| 7,551,474 B2 * | 6/2009 | Kim | .............................. | 365/149 |

FOREIGN PATENT DOCUMENTS

| | | |
|---|---|---|
| JP | 58-168310 A | 10/1983 |
| JP | 60-157797 A | 8/1985 |
| JP | 62-42397 A | 2/1987 |
| JP | 6-203587 A | 7/1994 |
| JP | 6-243678 A | 9/1994 |
| JP | 2000-505227 A | 4/2000 |
| JP | 2004-273110 A | 9/2004 |
| JP | 2005-182873 A | 7/2005 |
| JP | 2006-172683 A | 6/2006 |
| WO | 97/18564 A | 5/1997 |

* cited by examiner

*Primary Examiner* — Hoai V Ho
*Assistant Examiner* — Fernando N Hidalgo
(74) *Attorney, Agent, or Firm* — Sughrue Mion, PLLC

(57) ABSTRACT

In a semiconductor memory device, a memory cell is connected with a local sense amplifier and a global sense amplifier via a local bit line and a global bit line. The local sense amplifier is a single-ended sense amplifier including a single MOS transistor, which detects a potential of the local bit line which varies when reading and writing data with the memory cell. The threshold voltage of the MOS transistor is monitored so as to produce a high-level write voltage and a low-level write voltage, which are corrected and shifted based on the monitoring result so as to properly perform a reload operation on the memory cell by the global local sense amplifier. Thus, it is possible to cancel out temperature-dependent variations of the threshold voltage and shifting of the threshold voltage due to dispersions of manufacturing processes.

28 Claims, 14 Drawing Sheets

SEMICONDUCTOR MEMORY DEVICE

BACKGROUND OF THE INVENTION

1. Field of the Invention

The present invention relates to semiconductor memory devices such as dynamic random-access memories (DRAM), which are designed to cancel out characteristic dispersions of single-ended sense amplifiers each including a single metal-oxide semiconductor (MOS) transistor due to dispersions of threshold voltages of MOS transistors in manufacturing processes and due to temperature dependency thereof.

The present application claims priority on Japanese Patent Application No. 2008-98246, the content of which is incorporated herein by reference.

2. Description of Related Art

Conventionally, semiconductor memory devices having sense amplifiers compensating for characteristic dispersions due to temperature variations have been developed and disclosed in various documents such as Patent Documents 1-9.

Patent Document 1: Japanese Unexamined Patent Application Publication No. S58-168310

Patent Document 2: Japanese Unexamined Patent Application Publication No. S60-157797

Patent Document 3: Japanese Unexamined Patent Application Publication No. S62-42397

Patent Document 4: Japanese Unexamined Patent Application Publication No. 2004-273110

Patent Document 5: Japanese Unexamined Patent Application Publication No. 2005-182873

Patent Document 6: Japanese Unexamined Patent Application Publication No. 2006-172683

Patent Document 7: Japanese Unexamined Patent Application Publication No. H06-243678

Patent Document 8: Japanese Unexamined Patent Application Publication No. H06-203587

Patent Document 9: Japanese Patent Application Publication No.

Patent Document 1 teaches a sense amplifier which varies a reference signal level of a differential amplifier circuit based on temperature so as to stabilize an output signal of the differential amplifier circuit. This technology aims at adjusting the gain of the differential amplifier circuit and is not applicable to a single-ended sense amplifier including a single MOS transistor.

Patent Document 2 teaches a temperature-compensation bubble memory system, in which a temperature compensation circuit forms a temperature-compensated reference voltage based on an output signal of a temperature sensor so that a sense amplifier generates a logic level based on a threshold level corresponding to the reference voltage. Patent Document 2 fails to teach the specific circuit configuration regarding the temperature sensor, temperature compensation circuit, and the sense amplifier; hence, it is not applicable to a single-ended sense amplifier including a single MOS transistor.

Patent Document 3 teaches a temperature-compensation type sense amplifier in which a plurality of temperature-compensating parts is used to cancel out temperature variations regarding the resistance, β gain, and parasitic capacitance. This technology is preferably applicable to a bipolar sense amplifier but is not applicable to a single-ended sense amplifier including a single MOS transistor.

Patent Document 4 teaches a temperature-compensation PRAM sense amplifier compensating for temperature variations of the resistance of a memory resistor. This technology is designed to compensate for the temperature dependency of the memory resistor but is not designed to compensate for the temperature dependency of the sense amplifier; hence, it is not applicable to a single-ended sense amplifier including a single MOS transistor.

Patent Document 5 teaches a semiconductor memory device for improving sense margins. This technology is designed to shift a cell-plate voltage by a certain value based on write date at a write time, thus increasing accumulated charges. Patent Document 6 teaches a semiconductor device which is designed to prevent dispersions of write voltage due to dispersions of threshold voltages of transistors for selecting cells in a full write operation that is performed using a cell-plate voltage without boosting a word-line voltage.

Patent Document 7 teaches a dynamic RAM with its plate-voltage setting method and information processing system, in which a cell-plate voltage is controlled to set the same leak current for a capacitor of a DRAM cell in both high and low levels. However, these technologies are incapable of compensating for threshold-voltage variations of a single-ended sense amplifier.

Patent Document 8 teaches a sense amplifier with its data-line load circuit, level shifter, and amplification circuit, which are designed to stabilize the operation of a single-ended sense amplifier adapted to a memory. Patent Document 9 teaches a low-voltage dynamic memory, which is designed to narrow down the amplitude of a bit-line voltage of a memory cell to its median, thus reducing the leak current of a transistor for selecting a cell. Both technologies are incapable of compensating for threshold-voltage variations of a single-ended sense amplifier.

The present inventors have recognized that conventionally-known sense amplifiers compensating for characteristic variations due to temperature variations and conventionally-known technologies for improving sense margins are incapable of compensating for threshold-voltage variations of single-ended sense amplifiers.

The present invention is made in consideration of the above circumstances so as to provide a semiconductor memory device which is capable of canceling out characteristic dispersions of single-ended sense amplifiers due to dispersions of threshold voltages of MOS transistors in manufacturing processes and due to temperature dependency thereof.

SUMMARY

The invention seeks to solve the above problems, or to improve upon the problems at least in part.

In one embodiment of the present invention, a semiconductor memory device is constituted by a memory cell, a local bit line connected to the memory cell, a local sense amplifier including a field effect transistor (e.g. a MOS transistor Q1) which is connected to the local bit line with a first input/output terminal so as to perform a write operation and amplification with respect to the memory cell, a global bit line connected to the local sense amplifier with a second input/output terminal, a global sense amplifier which is connected to the global bit line so as to perform a write operation and amplification on the memory cell via the second input/output terminal, a threshold monitor circuit for monitoring a threshold voltage of the field effect transistor and temperature-dependent variations of the threshold voltage, and a generation circuit for generating a write voltage for the memory cell based on the monitoring result of the threshold voltage. The global sense amplifier applies the write voltage to the memory cell based on the write data of the memory cell while applying a read voltage to the memory cell based on the output voltage of the local sense amplifier.

In another embodiment of the present invention, a semiconductor memory device is constituted of a memory cell whose input/output terminal is connected to a local bit line, a local sense amplifier including a field effect transistor for amplifying a read signal voltage appearing on the local bit line when read data substantially having the same information as write data is read from the memory cell, a write amplifier for writing write data into the memory cell, a threshold monitor circuit for monitoring a threshold voltage of the field effect transistor and temperature-dependent variations of the threshold voltage, and a generation circuit for generating a write voltage based on the monitoring result of the threshold voltage. The field effect transistor of the local sense amplifier is a MOS transistor in which the gate thereof is connected to the local bit line, the source thereof is connected to the reference voltage, and the drain thereof forms an output node so as to serve as a single-ended sense amplifier which operates in the read operation. The write amplifier applies a write voltage to the memory cell based on the write data.

The present invention demonstrates the following effects.
(1) The hierarchical sense amplifier (i.e. the local sense amplifier and global sense amplifier) is designed to cancel out temperature-dependent variations of the threshold voltage of the field effect transistor serving as the single-ended sense amplifier and shifting of the threshold voltage due to dispersions of manufacturing processes, thus improving operation margins and stabilizing sense amplification.
(2) It is possible to increase the permissible range of threshold-voltage variations of field effect transistors included in a semiconductor chip; hence, it is possible to improve manufacturing yields with respect to large-scale DRAM using numerous sense amplifiers, thus reducing the manufacturing cost.
(3) Due to the monitoring of the temperature dependency of the field effect transistor, it is possible to cancel out and precisely compensate for temperature-dependent variations of the threshold voltage of the field effect transistor. Due to the broadened permissible range of threshold-voltage variations of field effect transistors included in a semiconductor chip, it is possible to manufacture highly-integrated and refined semiconductor memory devices with ease.

BRIEF DESCRIPTION OF THE DRAWINGS

The above features and advantages of the present invention will be more apparent from the following description of certain preferred embodiments taken in conjunction with the accompanying drawings, in which.

DETAILED DESCRIPTION OF PREFERRED EMBODIMENTS

Figure 1:
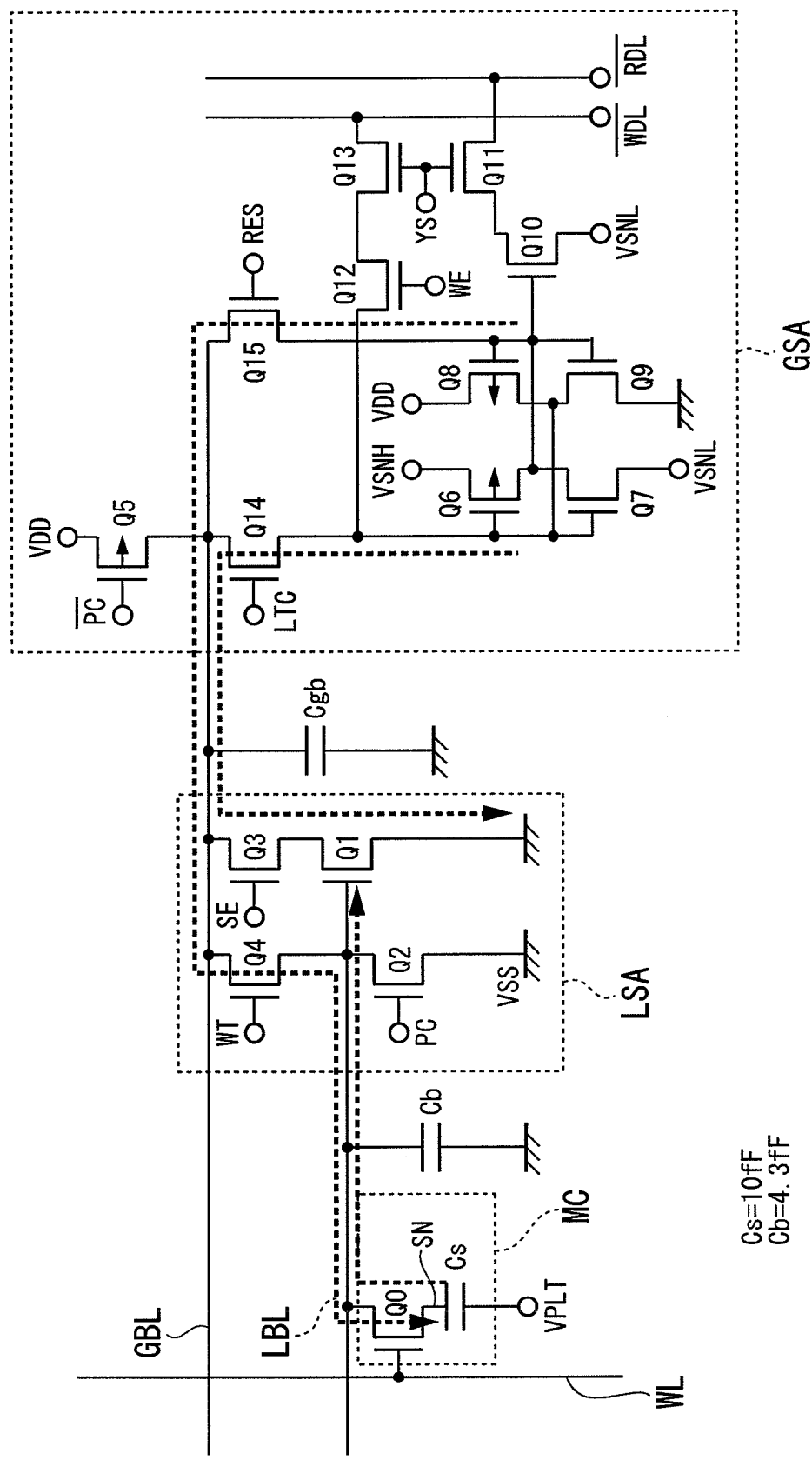
FIG. 1 is a circuit diagram showing a part of a semiconductor memory device including a threshold variation compensation circuit adapted to a local sense amplifier LSA and a global sense amplifier GSA in accordance with a preferred embodiment of the present invention.

The present invention will be now described herein with reference to illustrative embodiments. Those skilled in the art will recognize that many alternative embodiments can be accomplished using the teachings of the present invention and that the invention is not limited to the embodiments illustrated for explanatory purposes.

The present embodiment is directed to a single-ended sense amplifier including a MOS transistor whose gate receives a read signal voltage output onto a bit line, whose source is connected to a reference voltage such as a ground potential, and whose drain current is used to determine whether the read signal is set to "0" or "1".

Specifically, the present embodiment is directed to the direct sensing technology adapted to a single-ended sense amplifier which inputs and amplifies a single signal. Compared to single-ended sense amplifiers, generally-known differential sense amplifiers have high gains and high noise resistance. Such high gains of differential sense amplifiers reduce the time for varying amplified output signals. In contrast, single-ended sense amplifiers are very sensitive to noise and require high-level input signals subjected to amplification. The single-ended sense amplifier of the present embodiment (i.e. a local sense amplifier LSA) is a single-ended sense amplifier connected to a bit line.

The present embodiment is described with respect to a dynamic random-access memory (DRAM) having a hierarchical bit-line configuration, which is an example of a semiconductor memory device constituted of N-channel MOS transistors (i.e. NMOS transistors) and P-channel MOS transistors (i.e. PMOS transistors). The hierarchical bit-line configuration is capable of increasing the amplitude of a read signal from a memory cell because of the short length of the bit line and is capable of reducing the overall chip size; hence, it is preferable for the present embodiment, but this is not a restriction.

The present embodiment is applicable to volatile memory and nonvolatile memory other than DRAM, for example. It is possible for the present embodiment to use various types of field-effect transistors (FET) composed of a metal-oxide semiconductor (MOS), a metal-insulator semiconductor (MIS), and the like. In the present embodiment, the NMOS transistor represents a first conduction type transistor, while the PMOS transistor represents a second conduction type transistor.

The present embodiment does not adopt a half-precharge control method of a bit line, which is normally adapted to DRAM and in which the bit line before an access of a memory cell is controlled at a half voltage, i.e. a midpoint value of a relative voltage corresponding to "logic 1" and "logic 0", but adopts another control method in which the bit line is controlled at an internal voltage for driving a memory cell (e.g. an internal voltage dropped down from an external voltage) or a VSS power-supply voltage. Thus, the present embodiment is characterized in that the bit line after an access of the memory cell is controlled in voltage in a one-directional transition between the internal voltage and the VSS power-supply voltage irrespective of logic 1 or 0 stored in a memory cell. In a semiconductor storage device whose operation voltage decreases to approximately 1 V (i.e. a critical voltage close to an operation point of a CMOS sense amplifier), the present embodiment demonstrates synergistic effects multiplied by the sensing method of a single-ended sense amplifier in terms of control voltages of bit lines, thus achieving high-speed and stable operation and securing stability against dispersions of manufacturing processes.

FIG. 1 is a circuit diagram showing a part of a DRAM memory cell array including a threshold variation compensation circuit for a MOS transistor Q1 of a local sense amplifier LSA. FIG. 1 shows a word line WL, a local bit line LBL, a memory cell MC (positioned at an intersecting point between WL and LBL), a global bit line GBL, and a hierarchical sense amplifier compensating for threshold variations (i.e. local sense amplifier LSA coupled with a global sense amplifier GSA). The local sense amplifier LSA writes data into the memory cell MC and amplifies data of the memory cell MC, wherein it has a first input/output terminal connected to the local bit line LBL and a second input/output terminal connected to the global bit line GBL. The global sense amplifier GSA writes data into the memory cell MC via the local sense amplifier LSA and amplifies data of the memory cell MC, wherein it has a third input/output terminal connected to the global bit line GBL and a fourth input/output terminal communicating with an external device (not shown).

The MOS transistor Q1 of the local sense amplifier LSA is a sense transistor compensating for threshold-voltage variations, wherein the gate thereof is connected to the local bit line LBL so as to amplify a read signal voltage of the local bit line LBL, thus converting it into a drain current.

A MOS transistor Q2 for pre-charging the local bit line LBL controls the local bit line LBL to be placed at a prescribed potential before a read signal of the memory cell MC is transmitted to the local bit line LBL, wherein the gate thereof inputs a precharge signal PC so that the MOS transistor Q2 pre-charges the local bit line LBL at a VSS potential in a high-level period of the precharge signal PC. A MOS transistor Q3 used for selectively operating the local sense amplifier LSA receives a select signal SE at the gate thereof, wherein it is turned on in a high-level period of the select signal SE so as to selectively connect the drain of the MOS transistor Q1, which serves as an output node of the local sense amplifier LSA, to the global bit line GBL. In this connection, the source of the MOS transistor Q1 is connected to a reference voltage.

It is simply required that the MOS transistors Q1 and Q3 are connected in series irrespective of the connection order thereof. Since the global bit line GBL is connected with numerous MOS transistors (each serving as the MOS transistor Q3), it is preferable that the MOS transistor Q3 be directly connected to the global bit line GBL for the purpose of noise reduction as shown in FIG. 1.

Due to the hierarchical bit line configuration, the local sense amplifier LSA includes the MOS transistor Q1, which forms a single-ended sense amplifier for initially amplifying data of the memory cell MC transmitted thereto via the local bit line LBL, and the MOS transistor Q3 which is connected between the MOS transistor Q1 and the global bit line GBL so as to selectively operate the local sense amplifier LSA. The select signal SE becomes a high level in a read mode so as to turn on the MOS transistor Q3.

The MOS transistor Q3 is activated to connect the output of the MOS transistor Q1 (forming a single-ended sense amplifier) to the global bit line GBL. A control signal (e.g. the select signal SE) applied to the MOS transistor Q3 controls the connection between the output of the MOS transistor Q1 and the global bit line GBL, wherein it may include an address signal for selecting one global bit line and numeral local bit lines. Generally speaking, one local bit line is connected with numerous memory cells and a local sense amplifier so as to form a memory array; hence, wiring pitches between local bit lines are equal to or smaller than wiring pitches between global bit lines.

The global sense amplifier GSA performs a sense latch operation upon determination whether the potential of the global bit line GBL subjected to amplification by the local sense amplifier LSA is set to a high level or a low level. Specifically, the global sense amplifier GSA performs the sense latch operation in a high-level period of a latch signal LTC.

A latch determination circuit is constituted of an inverter including MOS transistors Q6 and Q7 and another inverter including MOS transistors Q8 and Q9. The output terminal of the inverter including the MOS transistors Q6 and Q7 is connected to the gate of a MOS transistor Q10 used for a read operation. In a high-level period of a select signal YS for selecting the global sense amplifier GSA, the MOS transistor Q10 transmits read data onto a read data line /RDL.

The input terminal of the latch determination circuit is connected with a MOS transistor Q12 for receiving write data, which an external device (not shown) writes into the memory cell MC, and a MOS transistor Q14 whose gate receives the latch signal LTC and is used for reading data from the memory cell MC.

The output terminal of the latch determination circuit is connected with a MOS transistor Q10 used in a read mode and a MOS transistor Q15 whose gate receives a reload signal RES so as to transmit write data onto the global bit line GBL. The MOS transistor Q15 is used for a reload operation for reloading the latched data (corresponding to the previously read data of the memory cell MC) into the memory cell MC.

It is possible to use different configurations suiting the read operation and the write operation of the latch determination circuit. That is, it is possible to use a read-specified latch determination circuit (corresponding to the above latch determination circuit) and a write-specified latch determination circuit (e.g. a write amplifier), which are coupled in parallel with the global bit line GBL. In a reload mode, the read-specified latch determination circuit is connected to the write-specified latch determination circuit via a control signal, wherein the write-specified latch determination circuit is placed in the memory cell array in proximity to the local sense amplifier LSA while the read-specified latch determination circuit is excluded from the memory cell array. Specifically, a write voltage generation circuit (not shown) generates a write voltage VSNH based on the monitoring result of a threshold monitoring circuit for monitoring the MOS transistor Q1, wherein it is possible to prevent the write voltage from dropping due to parasitic resistance of the global bit line GBL. This is achieved by the combination of the single-ended sense amplifier and the hierarchical bit line configuration.

Generally speaking, data is lost when being read from a DRAM memory cell, which therefore needs a reload operation. Specifically, when the latch signal LTC becomes a low level after the sense latch, then, the reload signal RES becomes a high level, the output terminal of the inverter including the MOS transistors Q6 and Q7 is connected to the global bit line GBL. After the select signal SE becomes a low level, a write signal WT becomes a high level so as to turn on the MOS transistor Q4 so that the local bit line LBL is connected to the global bit line GBL, thus completing the reload operation. The reload operation is performed based on a high level corresponding to VSNH and a low level corresponding to VSNL.

In the read mode, the global bit line GBL supplies the global sense amplifier GSA with a read voltage whose phase is inverse to the phase of the local bit line LBL for transmitting data "1" of the memory cell MC. In the write mode, the global bit line GBL supplies the memory cell MC with a write voltage whose phase is identical to the phase of the local bit line LBL for transmitting data "1". That is, the phase of the restored voltage of the global bit line GBL is inverse to the read voltage of the global bit line GBL. This effectively reduces the number of global bit lines included in the memory cell array.

The write voltage of the local bit line LBL is identical to the potential of the local bit line LBL occurring in response to read data "1" of the memory cell MC. This guarantees reloading or restoring of data using a single-ended sense amplifier with respect to the DRAM memory cell whose data is lost by reading. This effectively works in handling refresh defectiveness of data retention characteristics and ECC processing with respect to nonvolatile memory.

The memory cell MC is a DRAM memory cell in which a MOS transistor Q0 used for selecting the memory cell MC and a capacitor Cs (serving as a memory element) used for accumulating electric charge are connected in series. The memory cell MC has an input/output terminal used for communication with the local bit line LBL, which is positioned between the MOS transistor Q0 and the local bit line LBL. Numerous memory cells (not shown) are connected to the local bit line LBL. In FIG. 1, Cb designates a parasitic capacitance of the local bit line LBL. For instance, the capacitance of the capacitor Cs is 10 fF while the parasitic capacitance is 4.3 fF. In response to the voltage of the word line WL, the MOS transistor Q0 is selectively turned on so as to connect the capacitor Cs to the local bit line LBL.

Figure 2:
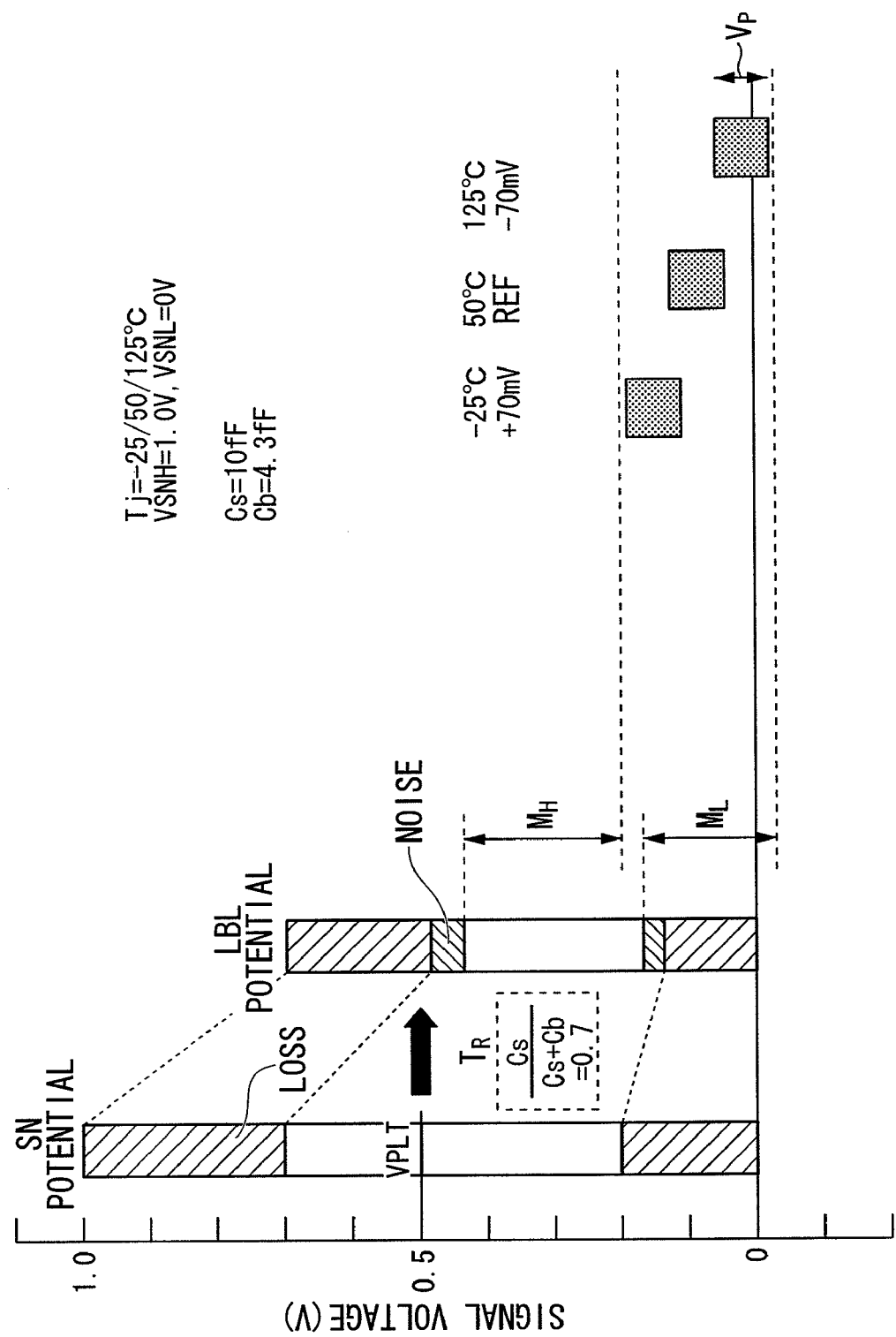
FIG. 2 is a graph showing a permissible range of threshold-voltage variations of a MOS transistor Q1 included in the local sense amplifier LSA without temperature-dependency compensation.

FIG. 2 shows the distribution of the threshold voltage Vt of the MOS transistor Q1 in the local sense amplifier LSA without compensation for temperature-dependent variations of the threshold voltage Vt, in other words, it shows a permissible range Vp of threshold-voltage variations of a semiconductor chip. Threshold-voltage variations of a semiconductor chip occur due to statistical dispersions of impurity densities of ion implantation (for implanting impurities into channels of transistors), dispersions of micro-scale dimensions in processing transistors, and the like. Threshold-voltage variations differ in terms of wafers due to variations of manufacturing processes, and they differ from shifting of threshold voltages in terms of manufacturing lots.

The following description is given with respect to temperature-dependent threshold-voltage variations, wherein it can be also applied to shifting of threshold voltages due to variations of manufacturing processes.

In FIG. 2, the vertical axis represents voltage, in which the bar graphs in the left show potentials occurring at a node SN of the memory cell MC when the power-supply voltage VDD is 1 V, wherein the bit-line precharge voltage is set to VSS (=0 V). High-level voltage of 1 V or low-level voltage of 0 V is applied to the node SN of the memory cell MC, whereas some loss may occur due to insufficient writing and leakage. It is estimated that the loss of the high-level voltage is 0.7 V while the loss of the low-level data is 0.2 V.

When the word line WL becomes a high level so as to select the memory cell MC, a read signal voltage is transferred onto the local bit line LBL due to a charge transfer between the capacitor Cs and the parasitic capacitance Cb of the local bit line LBL. The read signal voltage appearing on the local bit line LBL is reduced by a transfer ratio $T_R$ of the node SN, which is expressed as Cs/(Cs+Cb) (e.g. 0.7).

The read signal voltage appearing on the local bit line LBL is further changed due to noise, so that a high-level read voltage becomes 0.45 V while a low-level read voltage becomes 0.18 V.

The voltage difference is amplified by the MOS transistor Q1 and is thus converted into a drain current, so that the global sense amplifier GSA performs high/low determination based on a discharge-time difference of the global bit line GBL. In order to precisely perform high/low determination, it is necessary to introduce some determination margins between a lower limit of the high-level read voltage and the upper limit of the threshold voltage Vt of the MOS transistor Q1 and between the upper limit of the low-level read voltage and the lower limit of the threshold voltage Vt of the MOS transistor Q1.

Generally speaking, threshold voltages of MOS transistors vary with temperature dependency. In order to secure the above determination margins in a guaranteed temperature range between −25° C. and 125° C., for example, it is necessary to reduce threshold-voltage variations of a semiconductor chip as large as possible so as to absorb temperature-dependent variations of the threshold voltage Vt.

Figure 3:
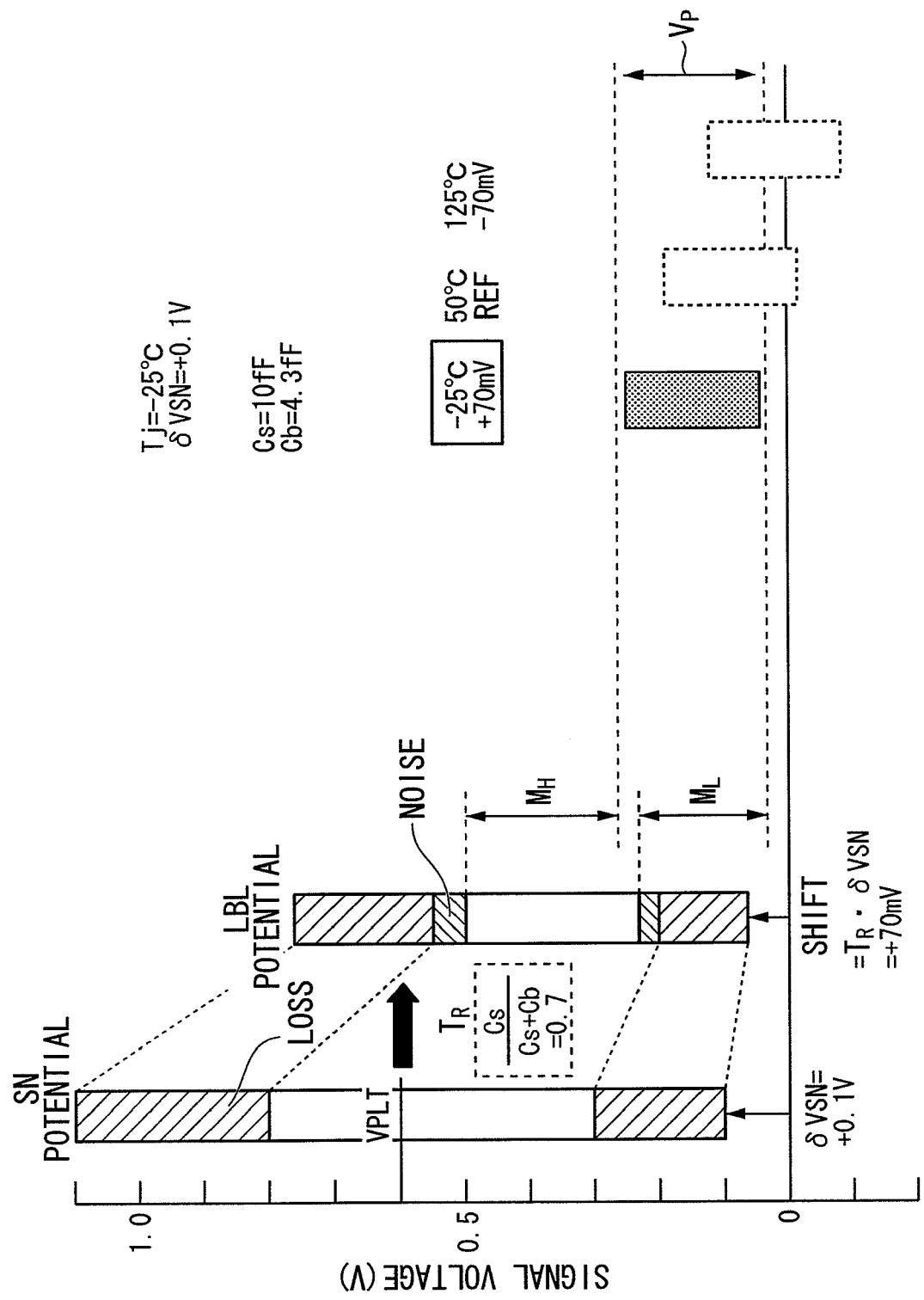
FIG. 3 is a graph showing a permissible range of threshold-voltage variations of the MOS transistor Q1 which is controlled by way of temperature-dependency compensation at −25° C.
Figure 4:
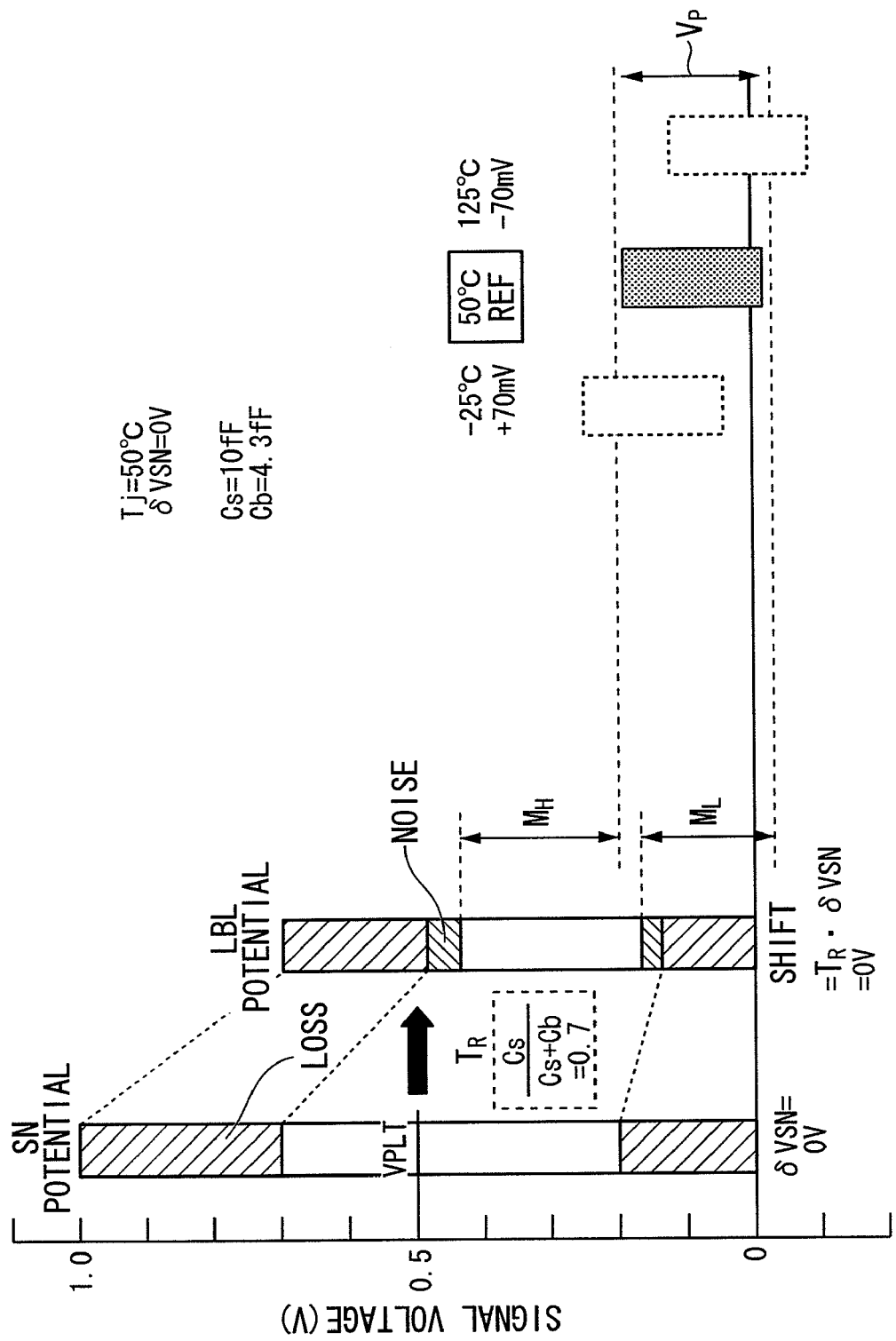
FIG. 4 is a graph showing a permissible range of threshold-voltage variations of the MOS transistor Q1 which is controlled by way of temperature-dependency compensation at 50° C.
Figure 5:
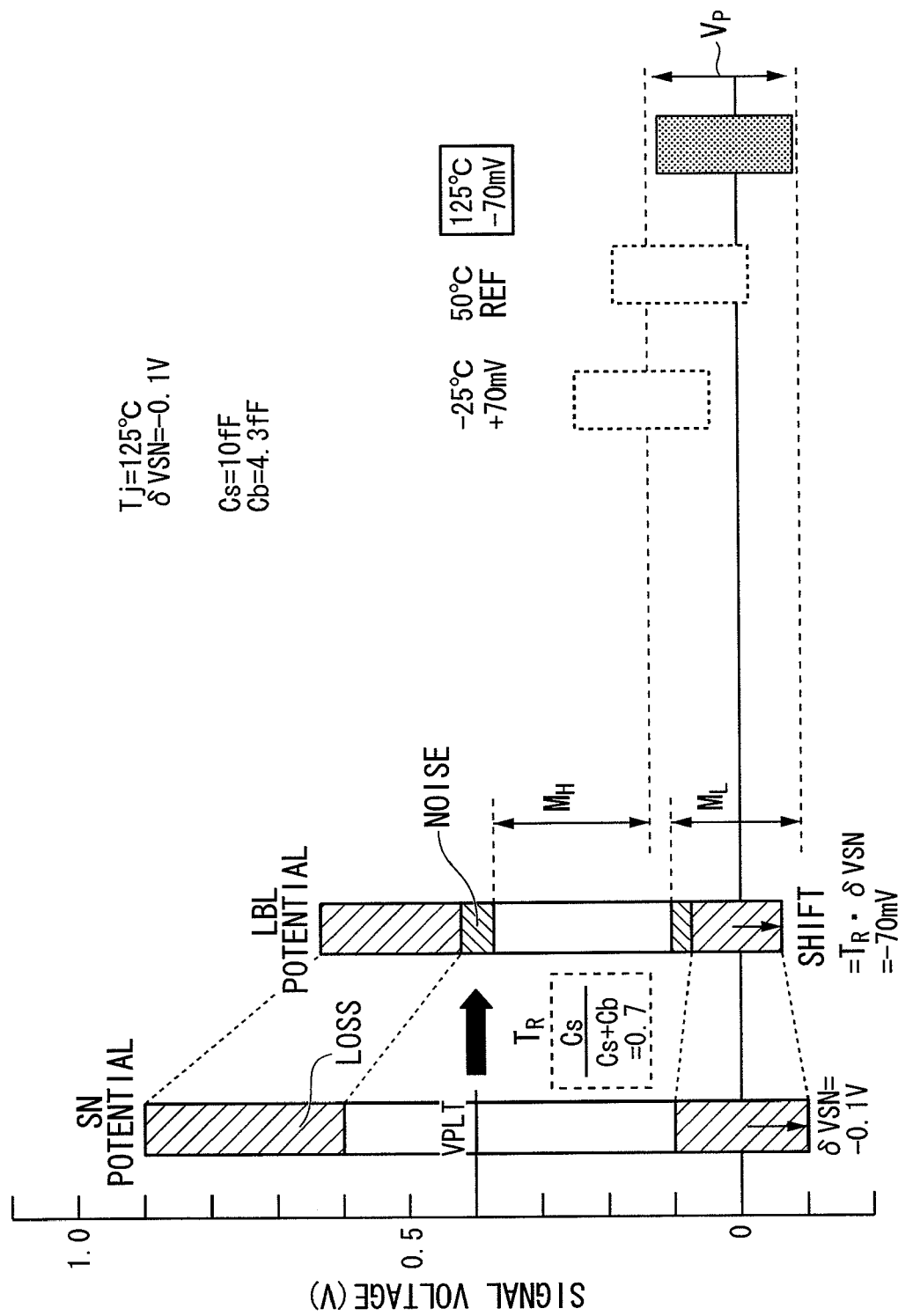
FIG. 5 is a graph showing a permissible range of threshold-voltage variations of the MOS transistor Q1 which is controlled by way of temperature-dependency compensation at 125° C.

Next, the operational principle of the threshold variation compensation circuit which compensates for temperature-dependent variations of the threshold voltage Vt of the MOS transistor Q1 will be described with reference to FIGS. 3 to 5, wherein graphical illustrations similar to those of FIG. 2 are not repeated so as to avoid duplicate descriptions. In FIGS. 3 to 5, $M_H$ designates a high-level determination margin, and $M_L$ designates a low-level determination margin with respect to the potential of the local bit line LBL.

The temperature-dependency compensation at Tj=−25° C. will be described with reference to FIG. 3, wherein the threshold voltage Vt of the MOS transistor Q1 increases by 70 mV at a reference temperature of 50° C. In this case, the high-level write voltage VSNH and the low-level write voltage VSNL used in the reload operation are set to 1.1 V and 0.1 V by a VSNH generation circuit and a VSNL generation circuit. Since the potential is increased by 0.1 V (i.e. a shift value δVSN) in the reload operation, the read signal voltage appearing on the local bit line LBL increases by 70 mV, which is calculated as Vs=$T_R$·δVSN=0.7×0.1=0.07 (V). This cancels out a 70 mV-increase due to the temperature dependency of the threshold voltage Vt of the MOS transistor. Thus, it is possible to increase the permissible range Vp of threshold-voltage variations of the MOS transistor Q1 in FIG. 3 compared to the permissible range Vp shown in FIG. 2 having no temperature-dependency compensation.

The temperature-dependency compensation at Tj=50° C., which is the reference temperature, will be described with reference to FIG. 4, wherein the threshold voltage Vt of the MOS transistor Q1 is denoted as the reference voltage. In this case, the high-level write voltage VSNH and the low-level write voltage VSNL are set to 1.0 V and 0 V. Since the shift value δVSN is 0 V, the same read signal voltage as the case of FIG. 2 having no temperature-dependent compensation is applied to the local bit line LBL, whereas the temperature dependency of the threshold voltage Vt of the MOS transistor Q1 at other temperatures is canceled out. For this reason, it is possible to increase the permissible range Vp in FIG. 4 compared to the permissible range Vp shown in FIG. 2 having no temperature-dependency compensation.

The temperature-dependency compensation at Tj=125° C. will be described with reference to FIG. 5, wherein the high-level write voltage VSNH and the low-level write voltage VSNL are set to 0.9 V and −0.1 V. Due to a 0.1V-drop of the write voltage, the read signal voltage appearing on the local bit line LBL decreases by 70 mV, which is calculated as $Vs=T_R \cdot \delta VSN=0.7 \times -0.1=-0.07$ (V). This cancels out a 70 mV-drop of the threshold voltage Vt of the MOS transistor Q1 due to the temperature dependency. Thus, it is possible to increase the permissible range Vp in FIG. 5 compared to the permissible range Vp in FIG. 2 having no temperature-dependency compensation.

Waveforms in read operations using the hierarchical sense amplifier (i.e. the local sense amplifier LSA and the global sense amplifier GSA) will be described with reference to FIGS. 6 to 8, which are related to FIGS. 3 to 5 with respect to the temperature-dependency compensation at Tj=−25° C., 50° C., and 125° C., wherein the vertical axis represents voltage while the horizontal axis represents time, and wherein the left-side portion of each graph is related to the read operation for reading high-level data from the memory cell MC while the right-side portion of each graph is related to the read operation for reading low-level data from the memory cell MC.

Figure 6:
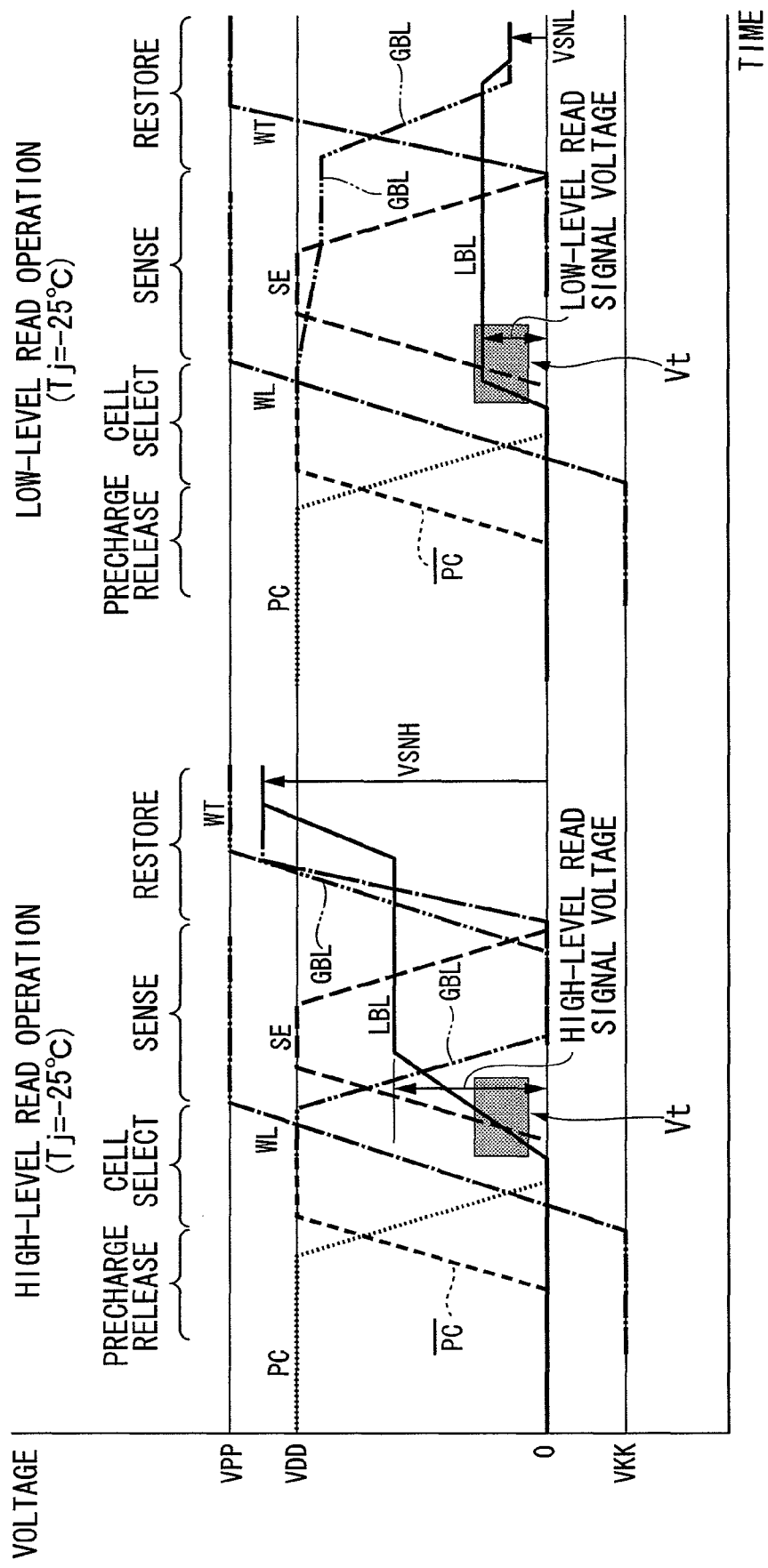
FIG. 6 is a graph showing waveforms in read operations in association with the temperature-dependency compensation at −25° C. in connection with the graph of FIG. 3.

FIG. 6 shows waveforms in read operations at Tj=−25° C., wherein the precharge voltage of the local bit line LBL is set to VSS=0 V, while the precharge voltage of the global bit line GBL is set to VDD.

In the read operation of high-level data, the precharge signal PC becomes a low level while the inverse precharge signal /PC becomes a high level in the precharge release period, wherein both the MOS transistors Q2 and Q5 are turned off so that the local bit line LBL is set to 0 V while the global bit line GBL is pre-charged at VDD and is thus placed in a floating state.

In the cell select period subsequent to the precharge release period, when the word line WL becomes a high level, a high-level signal voltage of the memory cell MC is read onto the local bit line LBL. Specifically, the memory cell MC is accessed so that electric charge thereof is transferred onto the local bit line LBL in accordance with the ratio of capacity between the memory cell MC and the local bit line LBL. After a lapse of a prescribed time, the sense period is started subsequently to the cell select period.

In FIG. 6, dark-colored blocks show variation ranges of the threshold voltage Vt of the MOS transistor Q1 which varies due to micro-scale dispersions of dimensions of transistors, dispersions of thicknesses of gate insulating films, and dispersions of impurities implanted into channels. When the select signal SE becomes a high level, the sense period is started subsequently to the cell select period. In the sense period, the potential of the local bit line LBL is higher than the upper limit of the variation range of the threshold voltage Vt of the MOS transistor Q1; hence, the drain current of the MOS transistor Q1 is large so that electric charge accumulated in the parasitic capacitance Cb of the global bit line GBL is rapidly discharged, whereby the potential of the global bit line GBL rapidly decreases from VDD to 0 V. Since the potential of the global bit line GBL is 0 V just after completion of the sense period, the global sense amplifier GSA initially detects a low level, which is inverted by the inverter including the MOS transistors Q6 and Q7, thus reading out the high-level data.

In the restore period subsequent to the sense period, the global bit line GBL is set to the high-level write voltage VSNH due to the operation of the inverter including the MOS transistors Q6 and Q7. When the select signal SE becomes a low level while the write signal WT becomes a high level, the local bit line LBL is set to VSNH, thus reloading high-level data into the memory cell MC.

In the read operation of low-level data, the precharge signal PC becomes a low level while the inverse precharge signal /PC becomes a high level in the precharge release period, wherein both the MOS transistors Q2 and Q5 are turned off, so that the local bit line LBL is set to 0 V while the global bit line GBL is pre-charged at VDD and is thus placed in a floating state.

In the cell select period subsequent to the precharge release period, the word line WL becomes a high level so that low-level signal data of the memory cell MC is read onto the local bit line LBL. When the select signal SE becomes a high level, the sense period is started subsequently to the cell select period. In the sense period, the potential of the local bit line LBL is slightly higher than the lower limit of the variation range of the threshold voltage Vt of the MOS transistor Q1; hence, the drain current of the MOS transistor Q1 becomes relatively low so that electric charge accumulated in the parasitic capacitance Cb of the global bit line GBL is slowly discharged, whereby the potential of the global bit line GBL slowly decreases from VDD.

Since the potential of the global bit line GBL is slightly lower than VDD just after completion of the sense period, the global sense amplifier GSA initially detects a high level, which is inverted by the inverter including the MOS transistors Q6 and Q7, thus reading out the low-level data.

In the restore period subsequent to the sense period, the potential of the global bit line GBL is set to VSNL due to the operation of the inverter including the MOS transistor Q6 and Q7. When the select signal SE becomes a low level while the write signal WT becomes a high level, the potential of the local bit line LBL is set to VSNL, thus reloading low-level data into the memory cell MC.

Since FIG. 6 is related to FIG. 3, the variation range of the threshold voltage Vt of the MOS transistor Q1 is higher than the reference value by 70 mV, wherein the reload operation is performed using the high-level write voltage VSNH=1.1 V or the low-level write data VSNL=0.1 V. Thus, the read signal voltage transferred onto the local bit line LBL becomes higher than the reference value by 70 mV, thus reliably compensating for variations of the threshold voltage Vt.

Figure 7:
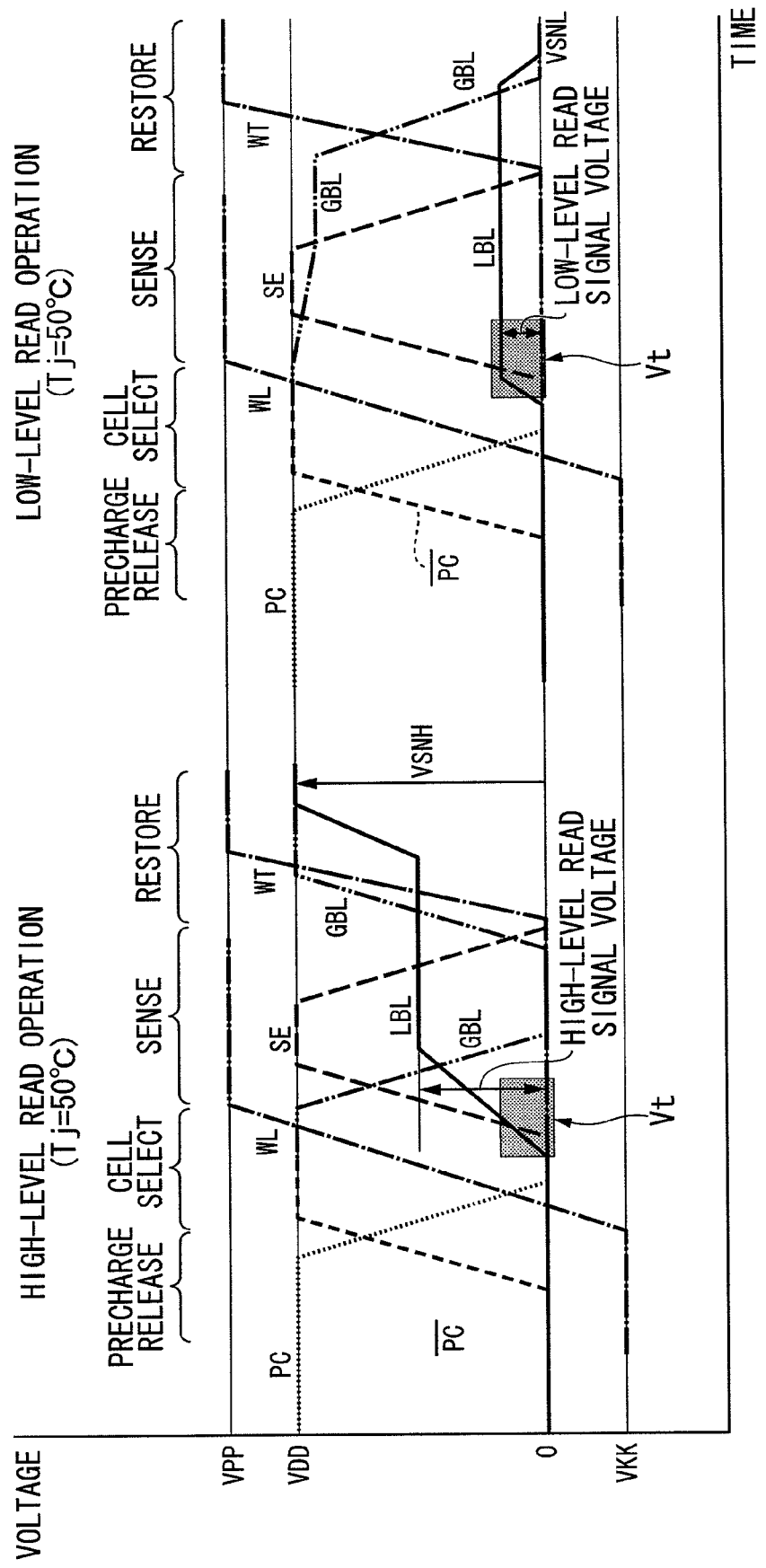
FIG. 7 is a graph showing waveforms in read operations in association with the temperature-dependency compensation at 50° C. in connection with the graph of FIG. 4.

FIG. 7 shows waveforms in read operations at Tj=50° C., wherein waveforms of FIG. 7 are similar to those of FIG. 6; hence, duplicate descriptions thereof are not repeated. FIG. 7 differs from FIG. 6 in that the reload operation is performed using the high-level write voltage VSNH=1.0 V or the low-level write voltage VSNL=0 V because the threshold voltage Vt is set to the reference value. That is, the read signal voltage of the memory cell MC transferred onto the local bit line LBL is identical to the reference value, thus achieving compensation for variations of the threshold voltage Vt.

Figure 8:
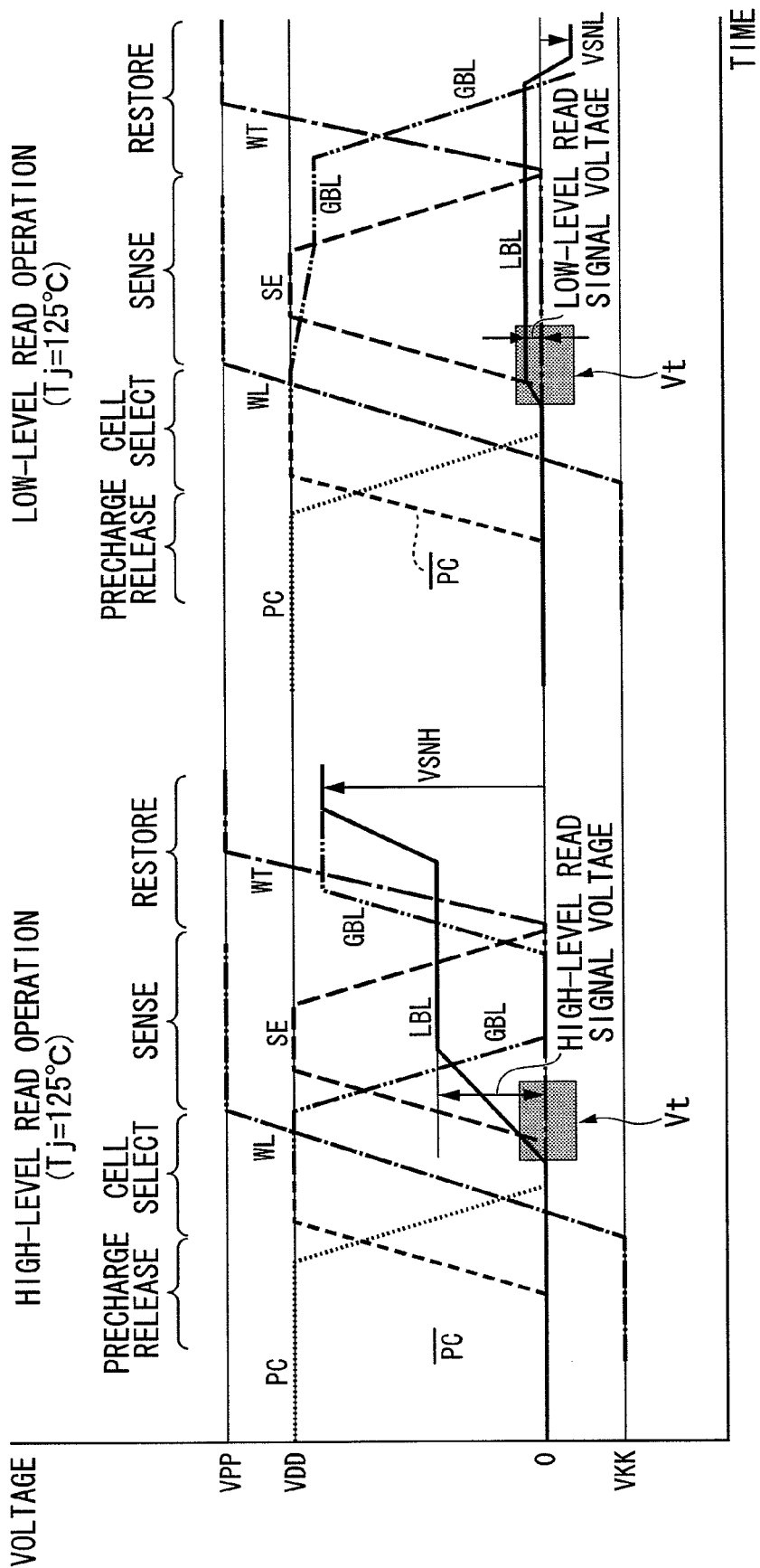
FIG. 8 is a graph showing waveforms in read operations in association with the temperature-dependency compensation at 125° C. in connection with the graph of FIG. 5.

FIG. 8 shows waveforms in read operations at Tj=125° C., wherein waveforms of FIG. 8 are similar to those of FIG. 6; hence, duplicate descriptions thereof are not repeated. FIG. 8 differs from FIG. 6 in that the reload operation is performed using the high-level write voltage VSNH=0.9 V and the low-level write voltage VSNL=−0.1 V because the threshold voltage Vt of the MOS transistor Q1 is lower than the reference value by 70 mV. That is, the read signal voltage of the memory cell MC transferred onto the local bit line LBL is lower than the reference value by 70 mV, thus achieving compensation for variations of the threshold voltage Vt.

Figure 9:
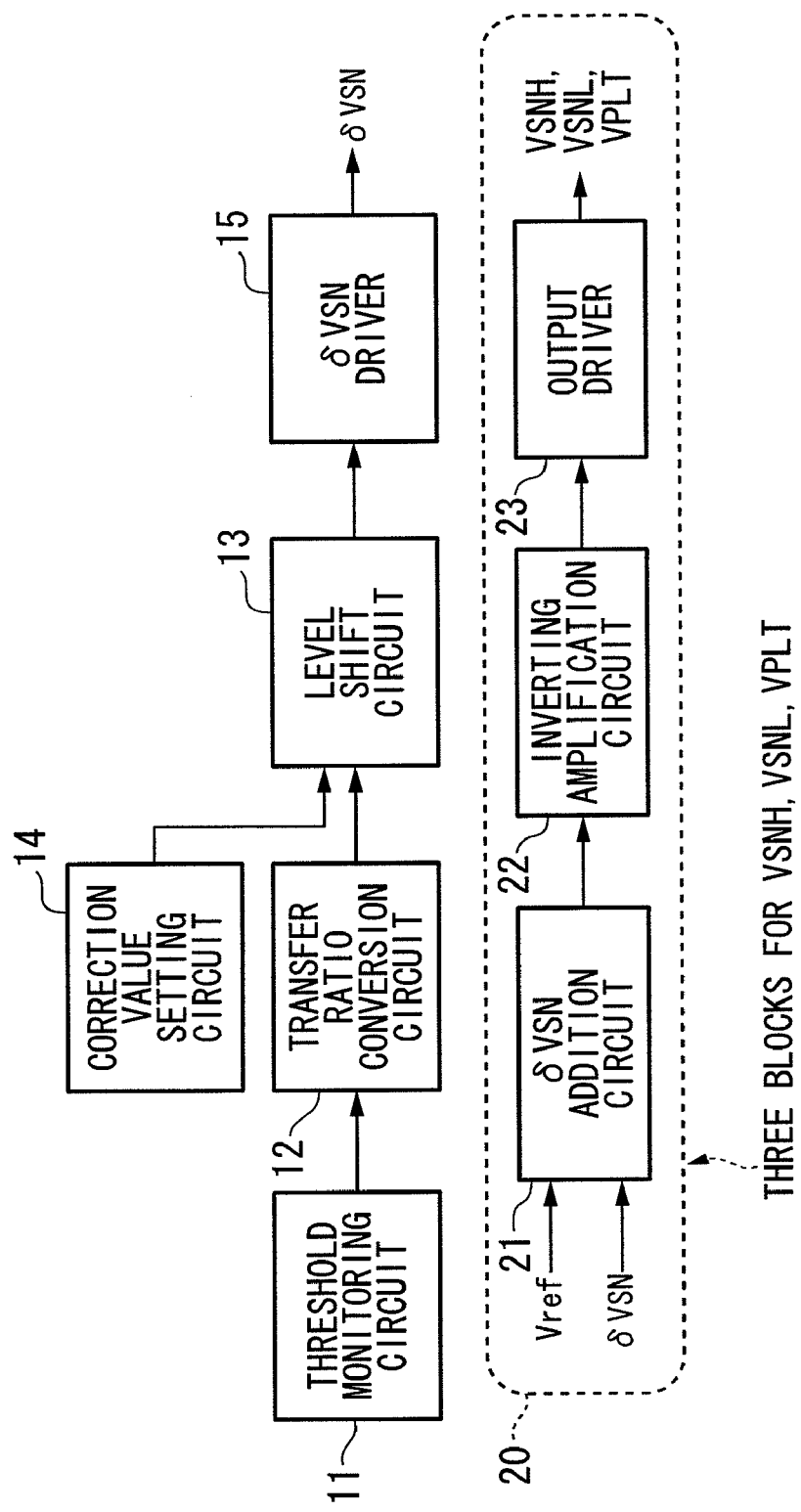
FIG. 9 is a block diagram showing three generation circuits for generating a high-level write voltage VSNH, a low-level write voltage VSNL, and a plate voltage VPLT.

FIG. 9 is a block diagram showing three generation circuits for generating the high-level write voltage VSNH and the low-level write voltage VSNL as well as a plate voltage VPLT applied between opposite electrodes of the capacitor Cs of the memory cell MC.

The voltage actually applied to the capacitor Cs of the memory cell MC is identical to "VSNH-VPLT" responsive to the high-level write voltage VSNH or "VPLT-VSNL" responsive to the low-level write voltage VSNL. It is preferable to reduce the maximum voltage applied to the dielectric film of the capacitor Cs, thus improving its reliability. For this reason, the plate voltage VPLT is normally set to a mid-point voltage between VSNH and VSNL.

In FIG. 9, the output voltage of a threshold monitor circuit 11 for monitoring the temperature dependency of the threshold voltage Vt of the MOS transistor Q1 is supplied to a transfer ratio conversion circuit 12, the output voltage of which is then supplied to a level shift circuit 13.

The level shift circuit 13 determines a shift value based on a correction value supplied thereto from a correction value setting circuit 14. In the present embodiment, the correction value setting circuit 14 sets the correction value based on the reference temperature of 50° C., at which the shift value δVSN is set to 0 V in connection with the design value of the threshold voltage Vt of the MOS transistor Q1. That is, the shift value δVSN is determined to compensate for the shifting of the threshold voltage Vt due to dispersions of manufacturing processes at the reference temperature.

In actuality, the correction value of the correction value setting circuit 14 is determined by way of programming, in which probe inspection is performed on DRAM so as to measure the threshold voltage Vt of the MOS transistor Q1 at the wafer temperature of 50° C., then, the shift value δVSN is monitored. When the threshold voltage Vt of the MOS transistor Q1 is identical to the design value, the shift value δVSN is set to 0 V. When the threshold voltage Vt is higher than the design value by 35 mV, the shift value δVSN is set to 50 mV, which is produced by dividing 35 mV by the transfer ratio $T_R$=0.7. When the threshold voltage Vt is lower than the design value by 35 mV, the shift value δVSN is set to −0.05 V, the absolute value of which is produced by dividing 50 mV by the transfer ratio $T_R$=0.7. Thus, it is possible to properly set the correction value even when the threshold voltage Vt is shifted from the design value which is determined in advance at the reference temperature.

Programming is performed using laser fuses, electric fuses, nonvolatile memories, one-time programmable elements, and the like. The level shift circuit 13 outputs the shift value δVSN, which is supplied to a δVSN driver 15 so as to enhance the current drive ability thereof. The output voltage of the δVSN driver 15 is supplied to the generation circuits 20 for generating VSNH, VSNL, and VPLT.

A predetermined reference voltage Vref is set to 1.0 V, 0 V, and 0.5 V with respect to VSNH, VSNL, and VPLT generation circuits 20 respectively. A δVSN addition circuit 21 adds the shift value δVSN to the reference voltage Vref so as to produce an addition signal, which is then inverted and amplified by an inverting amplification circuit 22. The output signal of the inverting amplification circuit 22 is supplied to an output driver 23 so as to enhance the current drive ability thereof. The output voltage of the output driver 23 is supplied to the memory cell array. Since the threshold monitoring circuit 11 monitors temperature-dependent variations of the threshold voltage Vt of the MOS transistor Q1, it is possible to properly set VSNH, VSNL, and VPLT to compensate for variations of the threshold voltage Vt.

Figure 10:
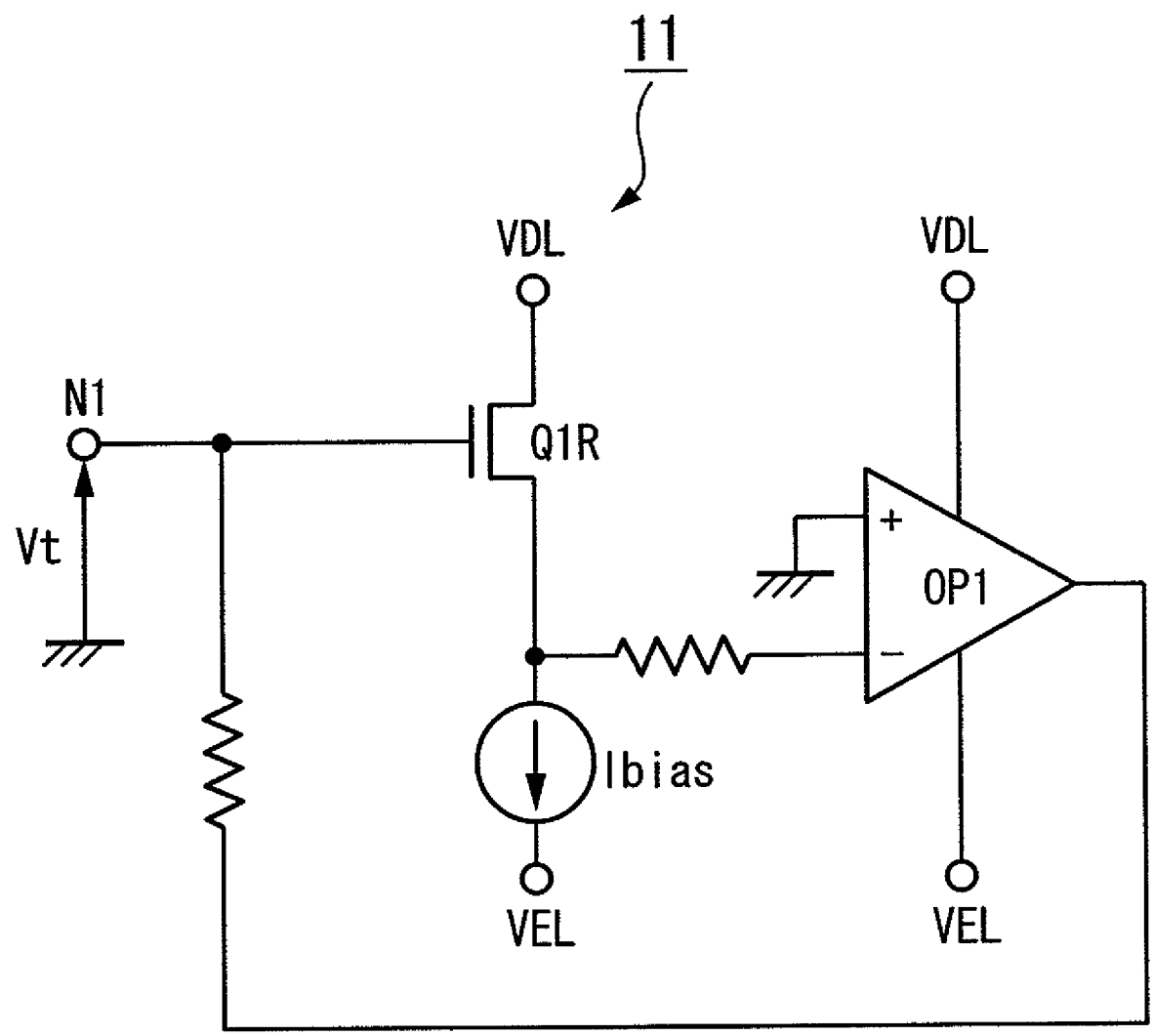
FIG. 10 is a circuit diagram showing the constitution of a threshold monitor circuit shown in FIG. 9.

FIG. 10 shows an example of the constitution of the threshold monitoring circuit 11 for monitoring the threshold voltage Vt of the MOS transistor Q1, which is constituted of a MOS transistor Q1R, a constant current source Ibias, and an operational amplifier OP1. Herein, VDL designates a positive constant voltage, and VEL designates a negative constant voltage. The MOS transistor Q1R is used to monitor the threshold voltage Vt of the MOS transistor Q1 and is designed so as to be approximately the same information as the MOS transistor Q1.

Figure 11:
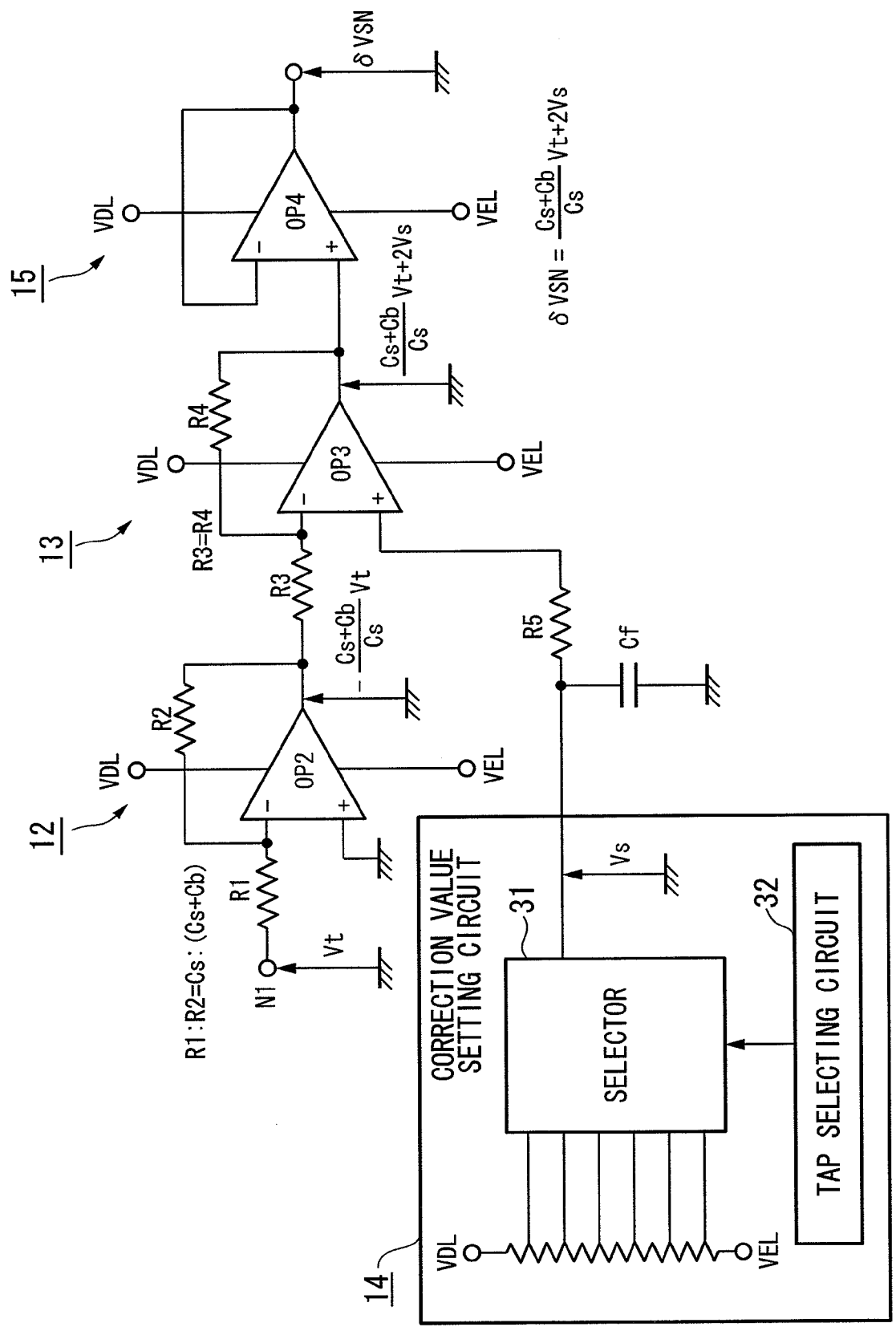
FIG. 11 is a circuit diagram showing the constitution including a transfer ratio conversion circuit, a level shift circuit, a correction value setting circuit, and a δVSN driver shown in FIG. 9.

FIG. 11 shows the constitution including the transfer ratio conversion circuit 12, the level shift circuit 13, the correction value setting circuit 14, and the δVSN driver 15. The transfer ratio conversion circuit 12 is an inverting amplifier circuit using an operational amplifier OP2, the inverting input terminal of which is connected to a node N1 having the threshold voltage Vt detected by the MOS transistor Q1R shown in FIG. 10. Since the ratio between resistors R1 and R2 is identical to the ratio between Cs and Cs+Cb, the output voltage of the operational amplifier OP2 is expressed as "−(Cs+Cb)Vt/Cs".

The level shift circuit 13 is an inverting amplification circuit using an operational amplifier OP3, the inverting input terminal of which receives the output voltage of the operational amplifier OP2, i.e. "−(Cs+Cb)Vt/Cs". The noninverting input terminal of the operational amplifier OP3, which is normally set to VSS, is applied with a shift voltage Vs corresponding to the correction value output from the correction value setting circuit 14 via a resistor R5. Since resistors R3 and R4 of the level shift circuit 13 are identical to each other (where R3=R4), and an amplification factor thereof is set to −1, the output voltage of the operational amplifier OP3 is expressed as "(Cs+Cb)Vt/Cs+2Vs".

The voltage difference between the positive constant voltage VDL and the negative constant voltage VEL is divided using resistor taps into numerous voltage divisions, preferably one of which is selected by a selector 31 and is output from the correction value setting circuit 14 as the shift voltage Vs. A tap selecting circuit 32 is programmed to select one of the voltage divisions, thus controlling the selector 31 to select a desired resistor tap. The shift voltage Vs of the correction value setting circuit 14 is supplied to the level shift circuit 13 via a capacitor Cf which is coupled with the resistor R5 to form a low-pass filter.

The δVSN driver 15 is a voltage-follower circuit using an operational amplifier OP4, which outputs the output voltage of the operational amplifier OP3 as the shift value ιVSN.

Figure 12:
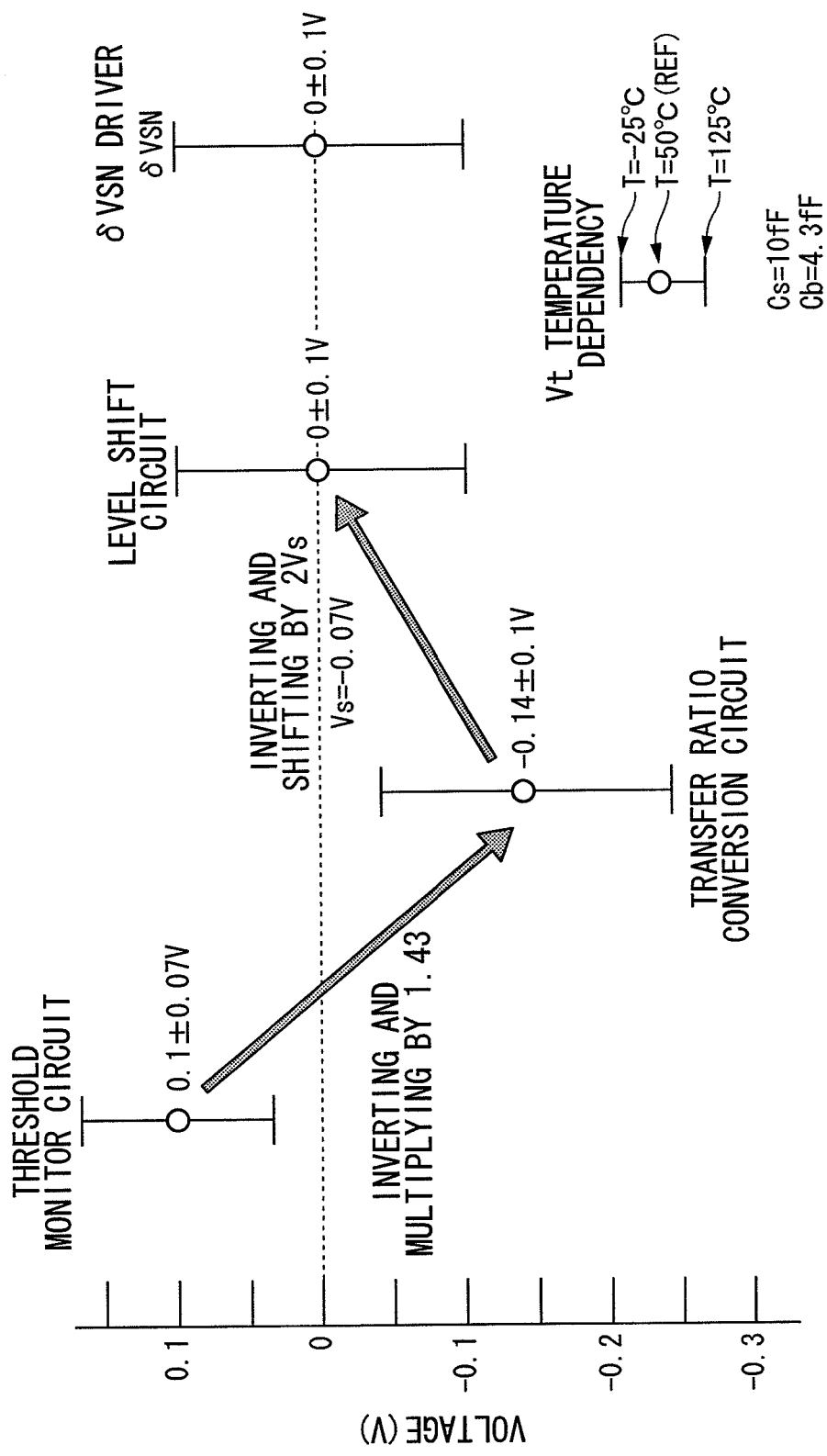
FIG. 12 is a graph showing the transition of voltages in producing the shift value δVSN in the precondition that the threshold voltage Vt falls within the design value.

The transitions of output voltages of the threshold monitor circuit 11, the transfer ratio conversion circuit 12, the level shift circuit 13, and the δVSN driver 15, which are used for producing the shift value δVSN, will be described with reference to FIGS. 12 and 13. The present embodiment is designed in the aforementioned condition where Cs=10 fF and Cb=4.3 fF. The threshold monitor circuit 11 monitors the threshold voltage Vt=0.1 V (i.e. the design value) at the reference temperature of 50° C. as well as temperature-dependent variations of ±0.07 V at −25° C. and 125° C. with respect to the MOS transistor Q1R. The monitored value of the threshold voltage Vt is inverted and multiplied by 1.43 in the transfer ratio inversion circuit 12, thus producing −0.14±0.1 V.

Subsequently, the output voltage of the transfer ratio conversion circuit 12 is inverted and shifted by 2 Vs in the level shift circuit 13. When the monitored value of the threshold voltage Vt at the reference temperature of 50° C. is identical to the design value of the MOS transistor Q1R, the output voltage of the level shift circuit 13 is set to 0 V; hence, the tap selecting circuit 32 of the correction value setting circuit 14 is programmed to set the shift voltage Vs=−0.7 V, thus outputting 0±0.1 V from the level shift circuit 13. The output voltage of the level shift circuit 13 is supplied to the δVSN driver 15, thus outputting the shift value δVSN.

Figure 13:
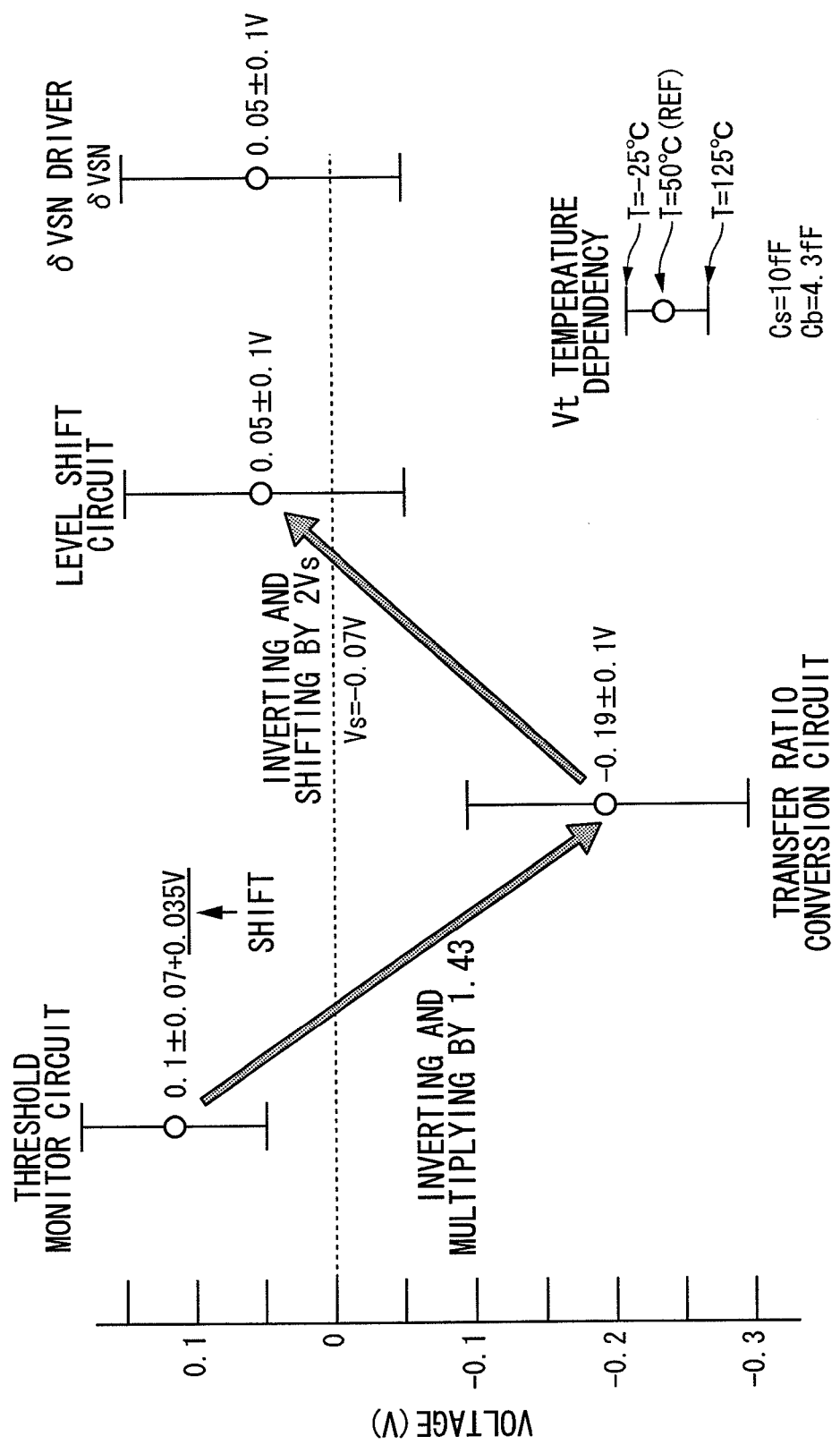
FIG. 13 is a graph showing the transition of voltages in producing the shift value δVSN in the precondition that the threshold voltage Vt is shifted from the design value.

FIG. 13 shows that the threshold voltage Vt of the MOS transistor Q1R becomes higher than the design value by 35 mV at 50° C. Herein, the transfer ratio conversion circuit 12 outputs −0.19±0.1 V, which is then inverted and shifted by 2 Vs in the level shift circuit 13. The level shift circuit 13 produces 0.05±0.1 V, which is output from the δVSN driver 15.

Figure 14:
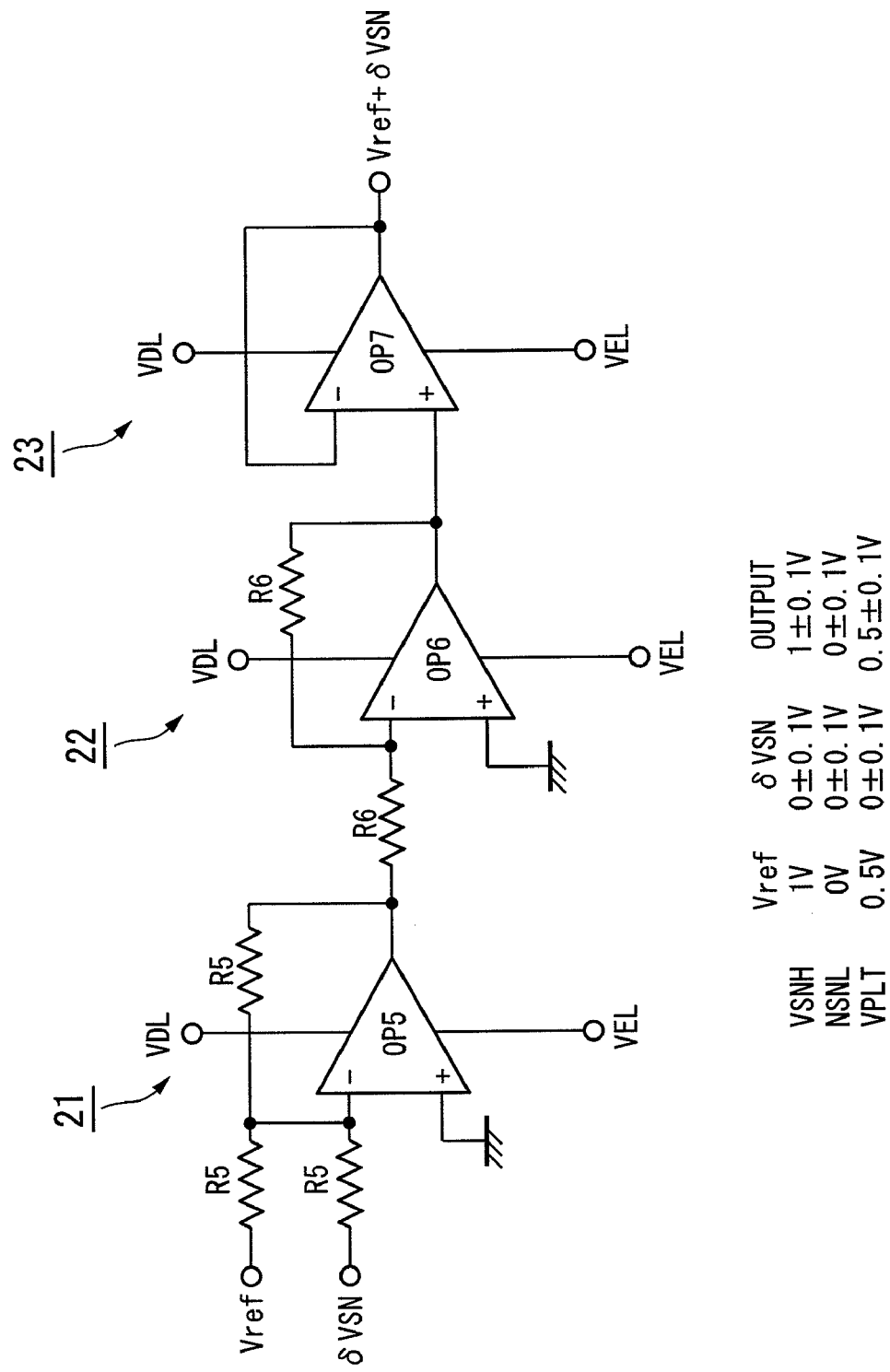
FIG. 14 is a circuit diagram showing the constitution including a δVSN addition circuit, an inverting amplification circuit, and an output driver shown in FIG. 9.

FIG. 14 shows the constitution including the δVSN addition circuit 21, the inverting amplification circuit 22, and the output driver 23 shown in FIG. 9. An operational amplifier OP5 of the δVSN addition circuit 21 adds the shift value δVSN to the reference voltage, then, it inverts the addition result. The output voltage of the ιVSN addition circuit 21 is inverted by an operational amplifier OP6 of the inverting amplification circuit 22. The output voltage of the inverting amplification circuit 22 is enhanced in the current drive ability by a voltage-follower operational amplifier OP7 of the output driver 23.

Since the reference voltage Vref is set to 1 V, 0 V, and 0.5 V with respect to VSNH, VSNL, and VPLT respectively, the generation circuits 20 produce VSNH=1±0.1 V, VSNL=0±0.1 V, and VPLT=0.5±0.1 V based on the shift value δVSN of 0±0.1 V.

As described above, the threshold-compensating sense amplifier of the semiconductor memory device of the present embodiment is designed to cancel out shifting of the threshold voltage Vt of the MOS transistor Q1 due to dispersions of manufacturing processes and temperature-dependent variations of the threshold voltage Vt, thus improving margins and stabilizing sense amplification. In other words, the present embodiment is capable of increasing the permissible range of variations of threshold voltages of MOS transistors in a semiconductor chip; hence, it is possible to improve manufacturing yields with respect to large-scale DRAM using numerous sense amplifiers, thus reducing the manufacturing cost.

Since the present embodiment is designed to monitor and cancel out temperature-dependent variations of the threshold voltage Vt of the MOS transistor Q1, it is possible to precisely compensate for temperature-dependent variations of the threshold voltage Vt. Since the present embodiment is capable of increasing the permissible range of variations of threshold voltages of MOS transistors in a semiconductor chip, it is possible to provide highly-integrated and refined memories.

The present invention is not necessarily limited to the present embodiment with respect to the constitution of the threshold-compensating sense amplifier, which can be modified in various ways.

The present embodiment can be applied to the technology regarding improvement of data retention characteristics of nonvolatile memories other than the aforementioned reload operation of DRAM. That is, the present embodiment is applicable to nonvolatile memories other than DRAM and is also applicable to sensing circuits other than memories.

Although the present embodiment is designed such that the threshold monitor circuit 11 monitors temperature-dependent variations of the threshold voltage of a field effect transistor serving as a single-ended sense amplifier, the present embodiment is not necessarily limited in such a way that the write voltages VSNH and VSHL are corrected upon the execution of the read operation.

According to the basic concept of the present invention, it is possible to correct the write voltages VSNH and VSNL based on the monitoring result of the threshold voltage Vt of the MOS transistor Q1 in the write operation which is not accompanied with the read operation. Thus, it is possible to achieve optimum sensing in the read operation based on data which is written into the memory cell MC based on the write voltages VSNH and VSNL.

All the MOS transistors are designed using optimal polarities (such as P-channel and N-channel); hence, when the polarities thereof are changed, the circuit configuration, the relationship between the power supply and ground, and the polarities of control signals must be correspondingly changed.

Lastly, it is apparent that the present invention is not limited to the above embodiment, but may be modified and changed without departing from the scope and spirit of the invention.

What is claimed is:

1. A semiconductor memory device comprising:
   a memory cell;
   a local bit line connected to the memory cell;
   a local sense amplifier including a field effect transistor, which is connected to the local bit line with a first input/output terminal, wherein the local sense amplifier writes data into the memory cell and amplifies data of the memory cell, and the field effect transistor which is used for reading;
   a global bit line which is connected to the local sense amplifier with a second input/output terminal;
   a global sense amplifier which is connected to the global bit line, wherein the global sense amplifier writes data into the memory cell via the second input/output terminal and amplifies data of the memory cell;
   a threshold monitor circuit for monitoring a threshold voltage of the field effect transistor and temperature-dependent variations of the threshold voltage; and
   a generation circuit for generating a write voltage for the memory cell based on a monitoring result of the threshold voltage,
   wherein the global sense amplifier applies the write voltage to the memory cell based on write data of the memory cell while applying a read voltage to the memory cell based on output voltage of the local sense amplifier
   wherein the global sense amplifier reads information of the memory cell based on the output voltage of the local sense amplifier, and then the global sense amplifier applies the write voltage to the memory cell based on the information of the memory cell that the local sense amplifier shows.

2. The semiconductor memory device according to claim 1, wherein the field effect transistor is a first transistor whose gate is connected to the first input/output terminal.

3. The semiconductor memory device according to claim 2, wherein the gate of the first transistor is connected to the local bit line, the source thereof is connected to a reference voltage, and the drain thereof is connected to the second input/output terminal, so that the first transistor serves as a single-ended sense amplifier so as to operate in a read operation.

4. The semiconductor memory device according to claim 1, wherein the local sense amplifier further includes a fourth transistor which is connected between the first input/output terminal and the second input/output terminal so as to operate in a write operation.

5. The semiconductor memory device according to claim 1, wherein the global sense amplifier includes a third input/output terminal connected to the global bit line, a fourth input/output terminal communicating with an external device, and a latch circuit, and wherein a read transistor is connected between the third input/output terminal and a first portion of the latch circuit and is turned on in the read operation, while a write transistor is connected between the third input/output terminal and a second portion of the latch circuit and is turned on in the write operation.

6. The semiconductor memory device according to claim 5, wherein the read data of the memory cell is transferred to the global sense amplifier via the read transistor and is then reloaded into the memory cell via the write transistor.

7. The semiconductor memory device according to claim 2, wherein a voltage having a phase inverse to a phase of high-level data of the memory cell which is read by the first transistor and is transferred onto the local bit line is supplied to the global sense amplifier via the global bit line in the read operation, while the global sense amplifier supplies the memory cell with a voltage having a phase identical to the phase of the high-level data of the memory cell in the write operation.

8. The semiconductor memory device according to claim 7, wherein the write voltage applied to the local bit line in the write operation is higher than a potential appearing on the local bit line when the local sense amplifier reads high-level data from the memory cell.

9. The semiconductor memory device according to claim 2, wherein the local sense amplifier further includes a second transistor which is connected between the first transistor and the global bit line so as to selectively supply an output current of the first transistor to the global bit line in the read operation.

10. The semiconductor memory device according to claim 1, wherein the threshold monitor circuit includes a field effect transistor having a same information as the field effect transistor of the local sense amplifier so as to monitor its threshold voltage, and wherein the generation circuit generates the write data based on the monitored threshold voltage.

11. The semiconductor memory device according to claim 10, wherein the memory cell is constituted by a field effect transistor and a capacitor.

12. The semiconductor memory device according to claim 11, wherein a high-level write voltage or a low-level write voltage is added with an offset voltage and is then applied to the capacitor, and wherein the monitored threshold voltage is multiplied by $(Cs+Cb)/Cs$, using a capacitance $Cs$ of the capacitor and a parasitic capacitance $Cb$ of the local bit line, and is then shifted by a shift value so as to produce the offset voltage.

13. The semiconductor memory device according to claim 12, wherein the shift value is determined in advance such that the write voltage applied to the capacitor becomes identical to a predetermined value which is predetermined with respect to the field effect transistor of the local sense amplifier at a reference temperature.

14. The semiconductor memory device according to claim 13, wherein the capacitor accumulates electric charge due to a difference between the write voltage, which is applied thereto via the local bit line, and a plate voltage which is approximately a midpoint voltage between the high-level of the write voltage and the low-level of the write voltage.

15. A semiconductor memory device comprising:
a memory cell whose input/output terminal is connected to a local bit line;
a local sense amplifier including a field effect transistor that amplifies a read signal voltage appearing on the local bit line when read data substantially having the same information as write data is read from the memory cell;
a write amplifier that writes the write data into the memory cell;
a threshold monitor circuit that monitors a threshold voltage of the field effect transistor and temperature-dependent variations of the threshold voltage; and
a generation circuit that generates a write voltage based on a monitoring result of the threshold voltage,
wherein the local sense amplifier transfers the write voltage related to the write data which the write amplifier outputs to the local bit line through the local sense amplifier,
wherein the field effect transistor of the local sense amplifier is a first transistor in which a gate thereof is connected to the local bit line, a source thereof is connected to a reference voltage, and a drain thereof forms an output node so as to serve as a single-ended sense amplifier which operates in a read operation, and
wherein the write amplifier applies the write voltage to the memory cell based on the write data.

16. The semiconductor memory device according to claim 15 further comprising a global bit line connected to the output node of the first transistor, a global sense amplifier connected to the global bit line together with the write amplifier, and a fourth transistor which is connected between the local bit line and the global bit line so as to operate in a write operation, wherein the global sense amplifier receives read data of the memory cell which is read by the local sense amplifier via the global bit line, and wherein the write amplifier writes write data of an external device into the memory cell via the global bit line and the fourth transistor.

17. The semiconductor memory device according to claim 16, wherein the write amplifier and the global sense amplifier share a latch circuit which latches the write data to be written into the memory cell and which latches the read data of the memory cell which is read by the local sense amplifier.

18. The semiconductor memory device according to claim 16, wherein the read data of the memory cell is once transferred to the global sense amplifier and is then reloaded into the memory cell by the write amplifier.

19. The semiconductor memory device according to claim 18, wherein the write amplifier and the global sense amplifier share a latch circuit which latches the write data to be written into the memory cell and which latches the read data of the memory cell which is read by the local sense amplifier.

20. The semiconductor memory device according to claim 18, wherein a voltage having a phase inverse to a phase of a potential appearing on the local bit line when the first transistor reads high-level data from the memory cell is supplied to the global sense amplifier via the global bit line in a read operation, while a voltage having a phase identical to the phase of the potential appearing on the local bit line is supplied to the memory cell in a write operation.

21. The semiconductor memory device according to claim 20, wherein a potential of the local bit line in the write operation is higher than a read signal voltage appearing on the local bit line when the local sense amplifier reads the high-level data from the memory cell in the read operation.

22. The semiconductor memory device according to claim 21, wherein the write amplifier and the global sense amplifier share a latch circuit which latches the write data to be written into the memory cell and which latches the read data of the memory cell read by the local sense amplifier.

23. The semiconductor memory device according to claim 16, wherein the local sense amplifier further includes a second transistor which is connected between the output node of the first transistor and the global bit line and which selectively supplies an output current of the first transistor to the global bit line in the read operation.

24. The semiconductor memory device according to claim 15, wherein the threshold monitor circuit includes a field effect transistor having the same information as the first transistor so as to monitor its threshold voltage, and wherein the generation circuit generates the write voltage based on the monitored threshold voltage.

25. The semiconductor memory device according to claim 15, wherein the memory cell is constituted of a field effect transistor and a capacitor.

26. The semiconductor memory device according to claim 25, wherein a high-level write voltage or a low-level write voltage is added with an offset voltage and is then applied to the capacitor, and wherein the monitored threshold voltage is multiplied by $(Cs+Cb)/Cs$, using a capacitance $Cs$ of the capacitor and a parasitic capacitance $Cb$ of the local bit line, and is then shifted by a shift value so as to produce the offset voltage.

27. The semiconductor memory device according to claim 26, wherein the shift value is determined in advance such that the write voltage applied to the capacitor becomes identical to a predetermined value which is predetermined with respect to the field effect transistor of the local sense amplifier at a reference temperature.

28. The semiconductor memory device according to claim 27, wherein the capacitor accumulates electric charge due to a difference between the write voltage, which is applied thereto via the local bit line, and a plate voltage which is approximately a midpoint voltage between the high-level write voltage and the low-level write voltage.

* * * * *

UNITED STATES PATENT AND TRADEMARK OFFICE
CERTIFICATE OF CORRECTION

PATENT NO. : 7,933,141 B2  Page 1 of 1
APPLICATION NO. : 12/416432
DATED : April 26, 2011
INVENTOR(S) : Kazuhiko Kajigaya et al.

It is certified that error appears in the above-identified patent and that said Letters Patent is hereby corrected as shown below:

In the Specification

Column 12; Line 62: delete " $tVSN.$ " and insert -- $\delta VSN.$ --
Column 13; Line 35: delete " $tVSN.$ " and insert -- $\delta VSN.$ --

Signed and Sealed this
Twenty-ninth Day of October, 2013

Teresa Stanek Rea
*Deputy Director of the United States Patent and Trademark Office*